United States Patent
Park et al.

(10) Patent No.: US 6,508,887 B1
(45) Date of Patent: Jan. 21, 2003

(54) RESIST REMOVING COMPOSITION AND RESIST REMOVING METHOD USING THE SAME

(75) Inventors: Dong-jin Park, Kyungki-do (KR); June-ing Gil, Kyungki-do (KR); Je-eung Park, Kyungki-do (KR); Sang-mun Chon, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 178 days.

(21) Appl. No.: 09/716,469

(22) Filed: Nov. 21, 2000

(30) Foreign Application Priority Data

Nov. 26, 1999 (KR) .............................................. 99-52995

(51) Int. Cl.$^7$ .............................. B08B 3/04; C11D 3/30; C11D 9/30
(52) U.S. Cl. ............................... 134/2; 134/1.3; 134/38; 134/39; 134/40; 510/175; 510/176; 510/386; 510/488; 510/493; 510/501; 510/502
(58) Field of Search ............................... 134/1.3, 2, 38, 134/39, 40; 510/175, 176, 386, 488, 493, 501, 502

(56) References Cited

U.S. PATENT DOCUMENTS 5,707,947 A  * 1/1998 Ward et al. ................. 510/176
6,274,537 B1 * 8/2001 Park et al. ................... 510/176
6,398,874 B2 * 6/2002 Park et al. ....................... 134/2

FOREIGN PATENT DOCUMENTS

| GB | 2199587 A | * 7/1988 | ............ C09D/9/00 |
| GB | 2340256 A | * 2/2000 | ............ G03F/7/42 |
| JP | 2131239 | * 5/1990 | ........... C07C/43/11 |
| JP | 11125917 | * 5/1999 | ............ C11D/7/50 |

OTHER PUBLICATIONS

Darbinyan et al, Synthesis of azole derivatives and polymers based on them, Inst. Org. Khi., Erevan, USSR, abstract only.*

* cited by examiner

Primary Examiner—Mark Kopec
Assistant Examiner—Brian P. Mruk
(74) Attorney, Agent, or Firm—Volentine Francos, PLLC

(57) ABSTRACT

A resist removing composition has an excellent capability for removing a resist, polymer, organometallic polymer and metal oxide and which does not attack underlying layers, and a resist removing method using the same. The resist removing composition includes alkoxy N-hydroxyalkyl alkanamide, at least one selected from the group consisting of alkanolamine, a polar material having a dipole moment of 3 or greater and an attack inhibitor, and hydrogen peroxide or at least one of a fluoride-based reducing agent and a hydroxide-based reducing agent.

37 Claims, 2 Drawing Sheets

RESIST REMOVING COMPOSITION AND RESIST REMOVING METHOD USING THE SAME

CROSS-REFERENCES TO RELATED APPLICATIONS

The present application claims priority under 35 U.S.C. § 119 to Korean Patent Application No. 99-52995 filed on Nov. 26, 1999, the entire contents of which are hereby incorporated by reference for all purposes.

BACKGROUND OF THE INVENTION

1. Field of the Invention

The present invention relates to a resist removing composition and a resist removing method using the same.

2. Description of the Related Art

In order to complete an integrated circuit, it is necessary to form various interconnection patterns, e.g., tungsten, aluminum, copper or titanium, titanum nitride interconnection patterns, and contact holes or via holes for exposing these interconnection patterns. A process for forming the interconnection patterns and contact holes or via holes includes a photolithographic process, an etching process, a resist removing process, a rinsing process and a drying process.

In particular, an important issue in the resist removing process is to completely remove resist and etching residues from the surface of a substrate as fast as possible while not attacking underlying layers. In general, the resist removing process is carried out by a combination of dry stripping, e.g., ashing, and wet stripping using an organic stripper. The wet stripping is for removing impurities such as remaining resist which is not completely removed during the ashing and/or residues generated during etching and ashing for forming interconnection patterns or contact (via) holes from the surface of an integrated circuit substrate. The residues to be removed include organic polymer produced by reaction of plasma and components constituting the resist pattern, such as carbon (C), hydrogen (H), or oxygen (O), organometallic polymer produced when interconnection materials are back-sputtered to side walls of the resist pattern and a contact or via hole during an etching or ashing step, insulating materials or metal oxide formed when an insulation layer under the interconnection pattern is over-etched and then back-sputtered.

An organic stripper currently in wide use includes basic amine reducing agent such as hydroxyamine, diglycolamine, monoethanolamine or methylethanolamine, a polar solvent such as alcohol and an organic acid such as catechol, as its essential components.

Since the basic amine of the organic stripper has a relatively weak reducing power, it cannot completely remove etching residues, e.g., a metal oxide, such as tungsten oxide or copper oxide, or organometallic polymer, produced when a new interconnection, e.g., a tungsten interconnection or a copper interconnection, is etched. Thus, before the ashing, a nitric acid treatment is necessary as a pre-ashing.

Since the conventional organic stripper is mainly composed of organic components, this stripper is not completely removed when rinses with only deionized water. Instead, this stripper remains on the substrate, thereby easily corroding the interconnection layer, and thus deforming the profile of the interconnection layer pattern. Thus, an alcohol-based rinsing agent such as isopropyl alcohol (IPA) must be used to rinse the stripper before executing a post-removal rinse. Therefore, the manufacturing process becomes more complicated and processing time is prolonged, thereby lowering productivity. Also, since nitric acid and IPA are further required in addition to the organic stripper, the manufacturing cost increases. In addition, since independent baths for the various steps are required, a resist removing facility becomes unnecessarily bulky.

SUMMARY OF THE INVENTION

The present invention is therefore directed to a resist removing composition and method which substantially overcomes one or more of the problems due to the limitations and disadvantages of the related art.

A first object of the present invention is directed to providing a resist removing composition having excellent removal qualities for resist, polymer, organometallic polymer and metal oxide, and which does not attack underlying layers exposed to the resist removing composition.

A second object of the present invention is to provide a method for removing a resist using the resist removing composition.

Accordingly, to achieve the above objects and advantages, the present invention is directed to providing a resist removing composition including alkoxy N-hydroxyalkyl alkanamide, at least one selected from the group consisting of alkanolamine, a polar material having a dipole moment of 3 or greater and an attack inhibitor, and at least one of a fluoride-based reducing agent and a hydroxide-based reducing agent.

In another aspect of the present invention, the resist removing composition includes alkoxy N-hydroxyalkyl alkanamide, at least one selected from the group consisting of alkanolamine, a polar material having a dipole moment of 3 or greater and an attack inhibitor, and hydrogen peroxide.

According to another aspect of the present invention, there is provided a resist removing method including the steps of providing a substrate, forming a resist layer on the substrate, and contacting the substrate with a resist removing composition and removing the resist layer, the resist removing composition comprising alkoxy N-hydroxyalkyl alkanamide, at least one selected from the group consisting of alkanolamine, a polar material having a dipole moment of 3 or greater and an attack inhibitor, and at least one of a fluoride-based reducing agent and a hydroxide-based reducing agent, or the resist removing composition comprising alkoxy N-hydroxyalkyl alkanamide, at least one selected from the group consisting of alkanolamine, a polar material having a dipole moment of 3 or greater and an attack inhibitor, and hydrogen peroxide.

The resist removing agent or resist removing composition according to the present invention has an excellent capability for removing the resist, is capable of effectively removing polymer, organometallic polymer and metal oxide, and does not attack the underlying layers exposed to the resist removing composition.

These and other objects of the present invention will become more readily apparent from the detailed description given hereinafter. However, it should be understood that the detailed description and specific examples, while indicating the preferred embodiments of the invention, are given by way of illustration only, since various changes and modifications within the spirit and scope of the invention will become apparent to those skilled in the art from this detailed description.

BRIEF DESCRIPTION OF THE DRAWINGS

The foregoing and other objects, aspects and advantages will be described with reference to the drawings, in which:

FIGS. 2A and 2B are plan views of tungsten interconnection processed with a photolithography step and a resist removing step, in which FIG. 2A illustrates the tungsten interconnection treated with a resist removing composition according to the present invention and FIG. 2B illustrates the tungsten interconnection treated with a conventional resist removing composition.

DESCRIPTION OF THE PREFERRED EMBODIMENTS

Figure 1:
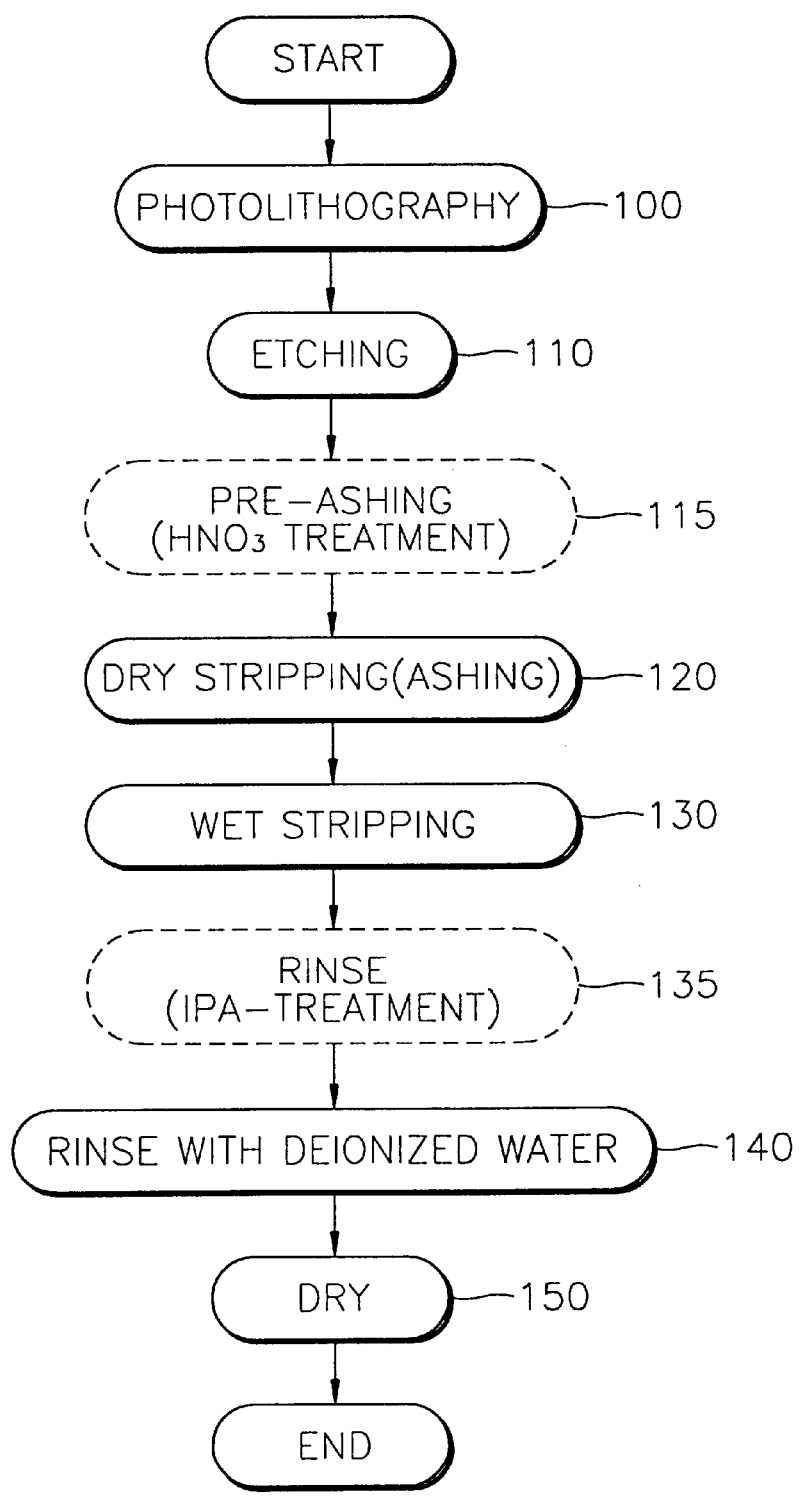
FIG. 1 is a flow diagram, wherein the solid lines indicate a process of removing a resist using a resist removing composition according to the present invention, and the dashed lines indicate the conventional steps eliminated by using the present invention.

Hereinbelow, a resist removing composition according to the present invention and a method for removing a resist using the same will be described in detail. The present invention may, however, be embodied in many different forms and should not be construed as limited to the embodiments set forth herein. Rather, these embodiments are provided so that this disclosure will be thorough and complete, and will fully convey the scope of the present invention to those skilled in the art.

A resist removing composition according to a first embodiment of the present invention includes an alkoxy N-hydroxyalkyl alkanamide, at least one compound selected from the group consisting of alkanol amine, a polar material having a dipole moment of 3 or greater, and an attack inhibitor, and at least one of a fluoride-based reducing agent and a hydroxide-based reducing agent.

The alkoxy N-hydroxyalkyl alkanamide is represented by formula (I):

$$R_4-O-R_3-CO-N-R_1R_2OH \quad (I)$$

wherein $R_1$ is a hydrogen atom, a $C_1$ to $C_5$ hydrocarbon or an aromatic hydrocarbon having one to three rings; $R_2$ is a $C_1$ to $C_5$ hydrocarbon or an aromatic hydrocarbon having one to three rings; and $R_3$ and $R_4$ are each any of the $C_1$ to $C_5$ hydrocarbons, independent of each other.

In the preferred embodiment, $R_1$ is a hydrogen atom, $R_2$ is $-CH_2CH_2-$, $R_3$ is $-CH_2CH_2-$, and $R_4$ is $-CH_3$.

The alkanolamine is a compound represented by the following formula (II):

$$R_1-NH-R_2OH \quad (II)$$

wherein $R_1$ is a hydrogen atom, a $C_1$ to $C_5$ hydrocarbon or an aromatic hydrocarbon having 1 to 3 rings, and $R_2$ is a $C_1$ to $C_5$ hydrocarbon or an aromatic hydrocarbon having 1 to 3 rings.

In the preferred embodiment of the present invention, the alkanolamine is monoethanolamine in which $R_1$ is hydrogen and $R_2$ is $-CH_2CH_2-$.

Suitable polar materials having a dipole moment of 3 or greater include water, methanol or dimethyl sulfoxide.

The attack inhibitor is represented by the following formula (III):

$$R_6-(OH)_n \quad (III)$$

wherein $R_6$ is a $C_1$ to $C_5$ hydrocarbon, a $C_1$ to $C_5$ hydrocarbon having a $-COOH$ group, an aromatic hydrocarbon having 1 to 3 rings, or an aromatic hydrocarbon having 1 to 3 rings and a $-COOH$ group in at least one ring. The integer n may have a value between and inclusive of 1 and 4.

Particularly, it is preferred that $R_6$ is a benzene ring and the attack inhibitor is catechol in which n is 2. Also, gallic acid is a widely known attack inhibitor that may be used within the present invention.

Suitable fluoride-based reducing agents include hydrogen fluoride (HF), ammonium fluoride ($NH_4F$) or hydroboron tetrafluoride ($HBF_4$).

Also, suitable hydroxide-based reducing agents include potassium hydroxide (KOH), ammonium hydroxide ($NH_4OH$), tetramethyl ammonium hydroxide (($CH_3)_4NH_4OH$) or tetraethyl ammonium hydroxide (($CH_3CH_2)_4NH_4OH$).

The resist removing composition according to the present invention has an excellent capability for removing the resist, and is capable of effectively removing polymer, organometallic polymer and metal oxide, and does not attack the underlying layers exposed to the resist removing composition. The resist removing composition according to the present invention functions in the following reaction mechanism.

The alkoxy N-hydroxyalkyl alkanamide contains a hydroxy group ($-OH$), an alkoxy group ($-OR_4$) and a carbonyl group ($C=O$). Consequently, the resist removing composition according to the present invention is very effective in exfoliation and dissolution of a resist and polymer.

Also, the polar material having a dipole moment of 3 or greater exhibits a high solubility with respect to cross-linked polymer and resist. In other words, the polymer strongly bonded on the side walls of the resist pattern and the surface of the exposed underlying layer can be effectively removed by such polar material.

Since the fluoride ion ($F^1$) of the fluoride-based reducing agent has a strong reducing power, it reduces metals contained in organometallic polymer or metal oxide.

The organometallic polymer is represented by formula (IV) and is a polymer produced when polymer ($P_R$) which is an etching or ashing residue is bonded with metal (M) or oxygen (O). When the metal component contained in the organometallic polymer is reduced by the fluoride ion, the bond between carbon and metal in the polymer is broken as expressed in the following reaction formula (1) to then be converted into the structure represented by formula (V):

[Reaction formula (1)]

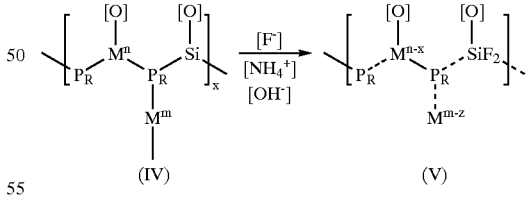

wherein $-[O]$ represents $-O$, $-OH$ or $-OR$, and "R" in the $-OR$ group represents a hydrocarbon group.

As shown in the above reaction formula (1), in addition to the fluoride ion, a hydroxy ion or an ammonium ion derived from the hydroxide-based reducing agent also reduces the organometallic polymer.

The organometallic polymer reduced as in the reaction formula (1) reacts with alkoxy N-hydroxyalkyl alkanamide, alkanolamine and the attack inhibitor, as represented in the following reaction formulas (2), (3) and (4), respectively. Reaction formulas (3) and (4) show examples in cases when the organometallic polymer reacts with monoalkanolamine as an example of alkanolamine and catechol as an example of the attack inhibitor, respectively.

[Reaction formula (2)]

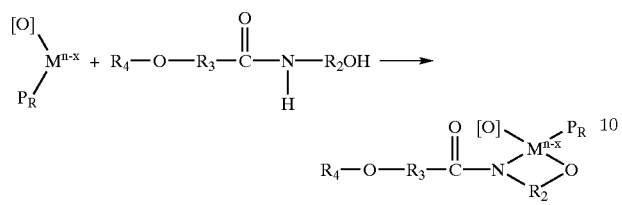

[Reaction formula (3)]

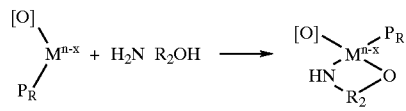

[Reaction formula (4)]

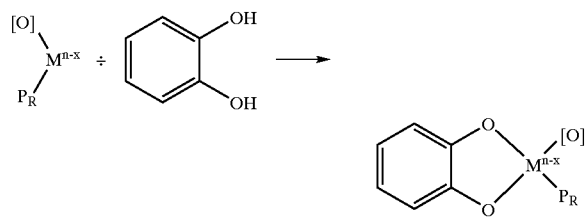

In the above reaction formulas (2), (3) and (4), the mechanisms of removing the reduced organometallic polymers have been described. However, alkoxy N-hydroxyalkyl alkanamide and alkanolamine may directly act on the unreduced organometallic polymers to remove the same.

Other etching residues, e.g., an oxide layer or metals contained in a metal oxide, may also be reduced by the reducing agent. For example, the reduction mechanisms of hydrogen fluoride (HF) as a fluoride-based reducing agent and tungsten oxide as a metal oxide are expressed in the following reaction formulas (5) and (6):

$2HF : 2F_2^{-} + 2H^+$ $SiO_2 + 2F_2^{-} : SiF_4$ [Reaction formula (5)]

$WO_3 + 6HF : WF_6 + 3H_2O$ [Reaction formula (6)]

The etching residues reduced by the fluoride-based reducing agent or the hydroxide-based reducing agent, or the etching residues reacted with alkoxy N-hydroxyalkyl alkanamide and alkanolamine are dissolved by the polar material having a dipole moment of 3 or greater.

The attack inhibitor prevents various layers exposed to the surface of an IC substrate from corroding or being attacked, as well as functions as a dissolving agent of the reduced organometallic polymer. Generally, metal oxide layers are formed on the surface of the interconnection pattern exposed to the surface of the IC substrate. When these metal oxide layers react with the reducing agent to then be changed into metal ions, the attack inhibitor reacts with the metal ions, which is referred to as a chelation reaction, thereby forming a chelate compound. Consequently, the surface of the exposed metal interconnection pattern is covered with the stable chelate compound. Thus, it is possible to effectively prevent the interconnection pattern from corroding or being attacked.

The attack inhibition mechanism for a metal layer is illustrated by the following reaction formula (7) for the case when the attack inhibitor is catechol:

[Reaction formula (7)]

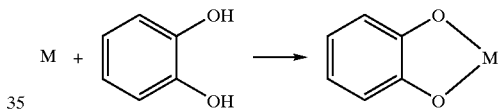

wherein M represents a metal.

The resist removing compositions according to a first embodiment of the present invention and weight % of various components are expressed in the following Table 1. In Table 1, the contents of the preferred compositions are given in parentheses.

TABLE 1

| Composition for removing resist | Alkoxy N-hydroxyalkyl alkanamide (wt %) | Alkanol amine (wt %) | Polar material (wt %) | Attack inhibitor (wt %) | F-based reducing agent (wt %) | OH-based reducing agent (wt %) |
|---|---|---|---|---|---|---|
| 1 | 30–99.9 | 0.01–69.9999 | | | 0.0001–1 | |
| 2 | 30–99.9 | 0.01–69.9999 | | | | 0.0001–1 |
| 3 | 30–99.9 | 0.01–69.9998 | | | 0.0001–1 | 0.0001–1 |
| 4 | 30–99.9 | | 0.01–69.9999 | | 0.0001–1 | |
| 5 | 30–99.9 | | 0.01–69.9999 | | | 0.0001–1 |
| 6 | 30–99.9 | | 0.01–69.9998 | | 0.0001–1 | 0.0001–1 |
| 7 | 30–99.9 | | | 0.01–69.9999 | 0.0001–1 | |
| 8 | 30–99.9 | | | 0.01–69.9999 | | 0.0001–1 |
| 9 | 30–99.9 | | | 0.01–69.9998 | 0.0001–1 | 0.0001–1 |
| 10 | 30–99.9 | 0.01–34.99995 | 0.01–34.99995 | | 0.0001–1 | |

TABLE 1-continued

| Composition for removing resist | Alkoxy N-hydroxyalkyl alkanamide (wt %) | Alkanol amine (wt %) | Polar material (wt %) | Attack inhibitor (wt %) | F-based reducing agent (wt %) | OH-based reducing agent (wt %) |
|---|---|---|---|---|---|---|
| 11 | 30–99.9 | 0.01–34.99995 | 0.01–34.99995 | | | 0.0001–1 |
| 12 | 30–99.9 | 0.01–34.9999 | 0.01–34.9999 | | 0.0001–1 | 0.0001–1 |
| 13 | 30–99.9 | 0.01–34.99995 | | 0.01–34.99995 | 0.0001–1 | |
| 14 | 30–99.9 | 0.01–34.99995 | | 0.01–34.99995 | | 0.0001–1 |
| 15 | 30–99.9 | 0.01–34.9999 | | 0.01–34.9999 | 0.0001–1 | 0.0001–1 |
| 16 | 30–99.9 | | 0.01–34.99995 | 0.01–34.99995 | 0.0001–1 | |
| 17 | 30–99.9 | | 0.01–34.99995 | 0.01–34.99995 | | 0.0001–1 |
| 18 | 30–99.9 | | 0.01–34.9999 | 0.01–34.9999 | 0.0001–1 | 0.0001–1 |
| 19 | 30–99.9 | 0.01–30 | 0.01–30 | 0.01–30 | 0.0001–1 | |
| 20 | 30–99.9 | 0.01–30 | 0.01–30 | 0.01–30 | | 0.0001–1 |
| 21 | 30–99.9 (40–65) | 0.01–30 (5–30) | 0.01–30 (5–20) | 0.01–30 (5–20) | 0.0001–1 (0.01–0.1) | 0.0001–1 (0.01–0.1) |

The contents of the above-described compositions are optimal contents in which a and polymer can be effectively removed, and the layer underlying the resist, e.g., a layer, exposed to a resist removing composition, is minimally attacked by such compositions.

As described above, the resist removing compositions have excellent capability for removing the resist and the polymer, organometallic polymer and metal oxide which are etching by-products. Also, they do not attack the layer underlying the resist, e.g., a metal layer. In addition, the above-described materials are cheaper than the components of the conventional resist removing compositions.

A resist removing composition according to a second embodiment of the present invention includes an alkoxy N-hydroxyalkyl alkanamide, at least one compound selected from the group consisting of alkanolamine, a polar material having a dipole moment of 3 or greater and an attack inhibitor, and hydrogen peroxide.

The resist removing composition according to a second embodiment of the present invention is different from that according to a first embodiment of the present invention only in that it includes hydrogen peroxide instead of a reducing agent (a fluoride-based reducing agent or a hydroxide-based reducing agent). Hydrogen peroxide also reacts with organometallic polymer to effectively remove the same. The other reaction mechanisms are the same as those in the first embodiment.

The resist removing compositions according to a second embodiment of the present invention and weight % of various components are expressed in the following Table 2.

TABLE 2

| Composition for removing resist | Alkoxy N-hydroxyalkyl alkanamide (wt %) | Alkanol amine (wt %) | Polar material (wt %) | Attack inhibitor (wt %) | OH-based reducing agent (wt %) |
|---|---|---|---|---|---|
| 1 | 30–99.9 | 0.01–69.9999 | | | 0.0001–1 |
| 2 | 30–99.9 | | | | 0.0001–1 |
| 3 | 30–99.9 | | 0.01–69.9999 | 0.01–69.9999 | 0.0001–1 |
| 4 | 30–99.9 | 0.01–34.99995 | | | 0.0001–1 |
| 5 | 30–99.9 | 0.01–34.99995 | 0.01–34.99995 | 0.01–34.99995 | 0.0001–1 |
| 6 | 30–99.9 | | 0.01–34.99995 | 0.01–34.99995 | 0.0001–1 |
| 7 | 30–70 (40–65) | 0.01–35 (5–30) | 0.01–30 (5–20) | 0.01–30 (5–20) | 0.0001–1 (0.01–0.1) |

Method for Preparing Resist Removing Composition

An alkoxy N-hydroxyalkyl alkanamide which is a main component of the resist removing composition according to the present invention is prepared by reacting alkanolamine represented by formula (II) and alkyl alkoxy alkanoate represented by formula (VI) as represented by the following reaction formula (8):

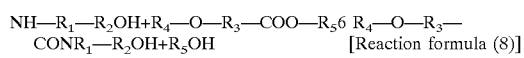

<II> <VI> <I> <VII> wherein $R_1$ is a hydrogen atom, a $C_1$ to $C_5$ hydrocarbon or an aromatic hydrocarbon having 1 to 3 rings; $R_2$ is a $C_1$ to $C_5$ hydrocarbon or an aromatic hydrocarbon having 1 to 3 rings; and $R_3$, $R_4$ and $R_5$ are each any of the $C_1$ to $C_5$ hydrocarbons, independent of each other.

The alkanolamine is preferably monoethanolamine in which $R_1$ is a hydrogen atom and $R_2$ is —$CH_2CH_2$—, and the alkyl alkoxy alkanoate is preferably methyl methoxy propanoate in which $R_3$ is —$CH_2CH_2$—, $R_4$ is —$CH_3$ and $R_5$ is —$CH_3$.

Here, to supply energy sufficient for this reaction, the reaction temperature is maintained at a temperature in the range from room temperature to about 120° C. In the preferred embodiment, the mixture is heated to a temperature in the range from about 80° C. to about 90° C.

As understood from the above reaction formula, amine (II) is reacted with ester (VI) to produce amide (I) and alcohol (VII).

While the alcohol (VII) is a $C_1$ to $C_5$ alcohol having a low boiling point, for example, methanol with a boiling point of about 60° C., the amide (I) is a material having a high boiling point, for example, methoxy N-hydroxyethyl propaneamide with a boiling point of about 200° C. Therefore, the alcohol (VII) is removed using fractional distillation to obtain an amide (I) compound. Preferably, fractional distillation is performed together with a nitrogen bubbling in the reaction bath, or vaporization of the alcohol (VII) is facilitated by reducing the pressure of the reaction bath. Of course, the two methods may be adopted simultaneously.

The resist removing compositions shown in Table 1 are prepared by first preparing an alkoxy N-hydroxyalkyl alkanamide according to the present invention in the above-described manner and then mixing therein at least one material selected from the group consisting of alkanolamine, an attack inhibitor, a material having a dipole moment of 3 or greater, and at least one reducing agent of a fluoride-based reducing agent and a hydroxide-based reducing agent, in the range of contents as shown in Table 1.

Also, the compositions 1 through 21 shown in Table 1 can be prepared as follows.

First, at least one of an attack inhibitor and a polar material, at least one of a fluoride-based reducing agent and a hydroxide-based reducing agent, alkanolamine and alkyl alkoxy alkanoate are mixed. Preferably, the alkanolamine and alkyl alkoxy alkanoate are mixed in a mixture ratio in which the total amount of alkyl alkoxy alkanoate can completely react with alkanolamine to be converted into amide. The temperature of the mixture is maintained at a temperature in the range from room temperature to about 120° C. Preferably, the mixture is heated to a temperature in the range from about 80° C. to about 90° C. The reaction time is 1 to 24 hours, preferably 1 to 12 hours. After the heating is completed, the reactant is left undisturbed for 1 to 7 hours at room temperature.

Subsequently, in order to remove alcohol having a low flash point generated as a by-product, fractional distillation is performed. Fractional distillation is performed together with a nitrogen bubbling in the reaction bath, or vaporization of the alcohol is facilitated by reducing the pressure of the reaction bath. Also, the two methods may be adopted simultaneously. Preferably, the fractional distillation is performed so that 7–8 weight % or less of alcohol remains with respect to total amount of composition.

The resist removing composition according to a second embodiment of the present invention is prepared in the same method as that for the resist removing composition according to a first embodiment of the present invention except that hydrogen peroxide is used instead of the reducing agent.

Method for Removing Resist

The steps of removing the resist using the resist removing agent and resist removing composition according to the present invention will be described with reference to the solid line steps in FIG. 1.

First, a resist pattern is formed through a photolithography step (step 100).

Subsequently, various processes for completing a semiconductor device, for instance, an etching (dry or wet) process or an ion implantation process, are performed using the resist pattern as a mask (step 110). Then, an ashing step which is a dry stripping process is performed on the substrate where the resist pattern is formed (step 120). Subsequently, a substrate where the resist pattern is formed is allowed to contact a resist removing agent or a resist removing composition listed in Table 1 to remove the resist, polymer and/or organometallic polymer (step 130). This may be achieved by placing the resist removing composition in a bath and then dipping the substrate into the bath. Alternatively, the resist removing composition may be sprayed onto the substrate as the substrate is moved through the spray.

In the case of using the resist removing compositions according to the present invention, the resist removal step is performed at a low temperature of 70° C. or below, specifically, in the range from room temperature to 70° C., preferably, from 45° C. to 70° C. A contact time in the range from about 10 to about 30 minutes is preferred.

The resist removed by the resist removing composition according to the present invention can be applied to a resist suitable for short wavelength exposure such as a resist for an ArF excimer laser (193 nm) as well as a resist for a conventional i-line (365 nm) resist or a resist for a KrF excimer laser (248 nm).

After the resist is completely removed, the resist removing agent, the resist removing composition and the dissolved resist remaining on the substrate are rinsed away (step 140). The rinsing step is performed using deionized water. If necessary, the rinsing step can be performed in two steps. Finally, the substrate is dried, for example, by a spin dry method or a dry method using isopropyl alcohol to remove the deionized water remaining on the substrate (step 150).

After the drying step 150, the substrate is transferred for subsequent processing. When resist is used again in a subsequent processing, the used resist is again removed through the steps shown in FIG. 1 after the intended subsequent processing is completed. The semiconductor device is completed through such repeated unit fabrication processes and resist removal steps.

As shown in FIG. 1, the resist removing composition according to the present invention has an excellent capability for removing the resist, polymer, organometallic polymer or metal oxide. Thus, the resist removing composition according to the present invention is suitable for a patterning process of new interconnection, e.g., tungsten interconnection or copper interconnection, or a process for forming contact (via) holes for exposing the new interconnection, either processing producing byproducts which are not easily removed by a conventional organic stripper. Accordingly, the pre-removal step 115 (dashed lines) is not necessary, unlike the conventional art. Also, since the layer underlying the resist is prevented from being attacked, the post-removal step 135 (dashed lines) can be omitted, unlike the conventional art. Thus, according to the present, the resist can be completely removed by a simple process, compared to the conventional resist removing process. Further, according to the present invention, a resist removing apparatus does not require baths necessary for performing the pre-removal step 115 and the post-removal step 135. Thus, the resist removing apparatus can be simplified. Also, since materials used in the pre-removal step and the post-removal step, such as nitric acid or IPA, are not necessary, the productivity of semiconductor devices can be remarkably enhanced.

The further details of the present invention are described with reference to the following examples, but it is understood that the invention is not limited to these specific examples.

Example 1

Preparation of Methoxy N-Hydroxyethyl Propanamide 200 ml of monoethanolamine (MEA) as an alkanolamine and 200 ml of methyl methoxy propanoate (MMP) as an ester were mixed. Subsequently, the mixture was heated at 90° C. for 5 hours. After heating, the reactant was restored to room temperature for 5 hours. Subsequently, methanol, which is a byproduct, was removed by fractional distillation, and the resultant material was analyzed by gas chromatography. The $^1$H-NMR data of the product is as follows: 6.8 ppm (1H), 3.7–3.8 ppm (4H), 3.4–3.5 ppm (3H), and 2.8–2.9 ppm (1H).

Example 2

Preparation of Resist Removing Composition and Evaluation of Same to Remove the Resist Resist removing compositions were prepared in a composition ratio shown in Table 3. The samples to be treated with the above-described resist removing composition were prepared in the following manner. First, BoroPhosphoSilicate Glass (BPSG) layers were formed to a thickness of 5000 Å on a plurality of substrates, respectively. Then, a titanium layer and a titanium nitride layer were formed to a thickness of 900 Å, respectively, and annealed. Then, a tungsten layer was deposited to a thickness of 2000 Å. Next, a silicon oxynitride (SiON) layer as an anti-reflective layer was formed on the tungsten layer. Then, a photoresist layer was coated on the SiON layer and then photolithography was performed to form a photoresist pattern defining a tungsten interconnection. The photoresist pattern was baked and then the silicon oxynitride layer, the tungsten layer, the titanium nitride layer and the titanium layer were sequentially etched, using the photoresist pattern as an etching mask. Here, as the etching gas of the tungsten layer, a mixed gas of sulfur hexafluoride, nitrogen and chlorine was used. As the etching gas of the titanium nitride layer and the titanium layer, a mixed gas of nitrogen and chlorine was used. After forming tungsten interconnection by the etching step, the photoresist pattern was removed by performing the ashing step using oxygen plasma. The samples prepared by the above-described manner were treated with the respective compositions listed in Table 3, respectively at 65EC for 20 minutes, and then the samples were examined using scanning electron microscopy (SEM).

TABLE 3

| Item | Methoxy-hydroxy ethyl propan-amide (wt %) | Mono-ethanol amine (wt %) | Catechol (wt %) | Water (wt %) | Ammonium fluoride | Potassium hydroxide | Hydrogen peroxide | Observations |
|---|---|---|---|---|---|---|---|---|
| 1 | 55.999 | 17 | 12 | 15 | 0.001 | | | ○ |
| 2 | 55.99 | 17 | 12 | 15 | 0.01 | | | ◎ |
| 3 | 55.9 | 17 | 12 | 15 | 0.1 | | | ◎ |
| 4 | 55.999 | 17 | 12 | 15 | | 0.001 | | ○ |
| 5 | 55.99 | 17 | 12 | 15 | | 0.01 | | ◎ |
| 6 | 55.9 | 17 | 12 | 15 | | 0.1 | | ◎ |
| 7 | 55.989 | 17 | 12 | 15 | 0.001 | 0.01 | | ◎ |
| 8 | 55.98 | 17 | 12 | 15 | 0.01 | 0.01 | | ◎ |
| 9 | 55.989 | 17 | 12 | 15 | 0.01 | 0.001 | | ◎ |
| 10 | 55.999 | 17 | 12 | 15 | | | 0.001 | ◎ |
| 11 | 55.99 | 17 | 12 | 15 | | | 0.01 | ⊙ |
| 12 | 55.9 | 17 | 12 | 15 | | | 0.1 | ⊙ |

(○: Good, ◎: better, ⊙: best)

The observations are characterized by the relative amounts of remaining polymer, organometallic polymer, metal oxide and resist, and the good state (indicated by symbol ○) is the similar state as that in the case of using the conventional resist removing composition EKC-245, the better state (indicated by symbol ◎) is the improved state, compared to the conventional case, and the best state (indicated by symbol ⊙) is the significantly improved state, compared to the conventional case, respectively. EKC-245 is a conventional resist removing composition having hydroxylamine, diglycolamine, catechol and water as its essential components.

From the above results, it was observed that the resist removing composition according to the present invention could easily remove resist, polymer, organometallic polymer, metal oxide and the like.

Example 3

Evaluation of Appropriate Processing Time

To verify appropriate processing time, the composition corresponding to item number 11 shown in Table 3 was used, and the resist was removed at different processing times as listed in Table 4. The other processing conditions were the same as those in Example 2. The removal state of the resist, polymer and organometallic polymer was observed using SEM.

TABLE 4

| Item | Processing time (min) | Observations of resist removing capability |
|------|----------------------|-------------------------------------------|
| 1 | 10 | ⊚ |
| 2 | 15 | ⊙ |
| 3 | 20 | ⊙ |
| 4 | 25 | ⊙ |
| 5 | 30 | ⊙ |

(⊚: better, ⊙: best)

From the result shown in Table 4, it was observed that the most appropriate processing time for removing the resist includes times from ten to thirty minutes.

Example 4

Evaluation of Appropriate Processing Temperature

To verify appropriate processing temperature, the composition corresponding to number 11 shown in Table 3 was used, and the resist was removed at different processing times as listed in Table 5. The other processing conditions were the same as those in Example 3. The removal state of the resist, polymer and organometallic polymer was observed using SEM.

TABLE 5

| Item | Processing temperature (° C.) | Observations of resist removing capability |
|------|------------------------------|-------------------------------------------|
| 1 | 45 | ⊙ |
| 2 | 50 | ⊙ |
| 3 | 55 | ⊙ |
| 4 | 60 | ⊙ |
| 5 | 65 | ⊙ |
| 6 | 70 | ⊙ |

The symbols in Table 5 are the same as those in Table 4.

From the result shown in Table 5, it was observed that the resist removal occurred rapidly in the lower temperature range from about 45° C. to about 70° C.

Example 5

Comparison of Resist Removing Capability

The tungsten interconnection was formed using the resist pattern in the same manner as that of Example 2, the resist was removed with the composition corresponding to item number 11 shown in Table 3, the processing time was twenty minutes, and the reaction temperature was 60° C. The resultant material was observed using SEM, and the observation results are shown in FIG. 2A which is a schematic plan view of an observed SEM photograph.

In a comparative example, the resist was removed using the conventional resist removing composition EKC-245, with other conditions being the same as those in the above described examples, and then the resultant material was observed using SEM. The observation results are shown in FIG. 2B which is a schematic plan view of an observed SEM photograph.

Figure 2A:
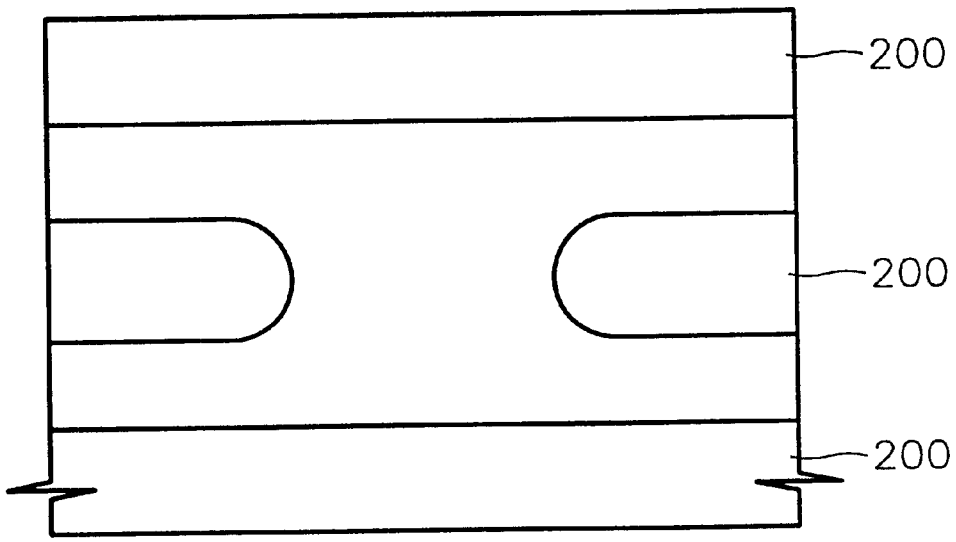
Figure 2B:
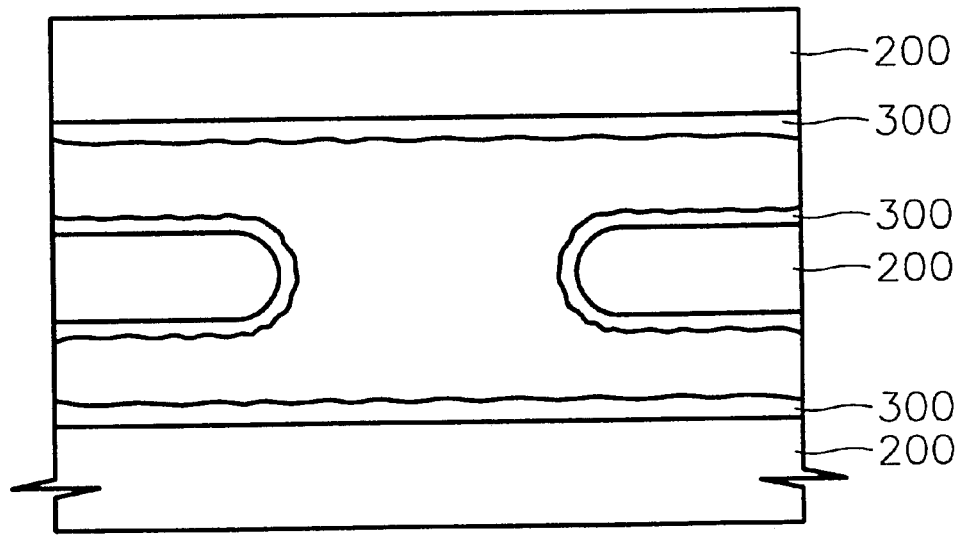

When FIGS. 2A and 2B are compared, one can see that a tungsten interconnection 200 having a good profile was formed, the resist and polymer were completely removed when the resist removing composition according to the present invention was used, while the resist and polymer 300 partially remains around the tungsten interconnection 200 when the conventional resist removing composition, e.g., EKC-245, was used.

As described above, the resist removing composition according to the present invention has a capability for removing a resist and can effectively remove polymer, organometallic polymer and metal oxide. Also, the layer underlying the resist is not attacked. Therefore, when the resist removing composition according to the present invention is used, it is not necessary to perform a pre-removal step for removing the polymer and a post-removal step for preventing the underlying layer from being attacked. Thus, the resist removing process can be simplified and the processing time can be reduced. Also, since the resist removing composition exhibits sufficient activity at a low temperature, the temperature required for removing the resist can be set to a lower temperature. Further, the resist removing apparatus can be simplified and made more compact.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A resist removing composition comprising:
   an alkoxy N-hydroxyalkyl alkanamide;
   at least one selected from the group consisting of alkanolamine, a polar material having a dipole moment of 3 or greater and an attack inhibitor; and
   at least one of a fluoride-based reducing agent and a hydroxide-based reducing agent.

2. The resist removing composition according to claim 1, wherein the alkoxy N-hydroxyalkyl alkanamide is of the formula (I):

$$R_4\text{—}O\text{—}R_3\text{—}CO\text{—}N\text{—}R_1R_2OH \qquad (I)$$

wherein:
   $R_1$ is a hydrogen atom, a $C_1$ to $C_5$ hydrocarbon or an aromatic hydrocarbon having 1 to 3 rings,
   $R_2$ is a $C_1$ to $C_5$ hydrocarbon or an aromatic hydrocarbon having 1 to 3 rings, and
   $R_3$ and $R_4$ are, independently, a $C_1$ to $C_5$ hydrocarbon.

3. The resist removing composition according to claim 1, wherein the alkanolamine is of the following formula (II):

$$R_1\text{—}NH\text{—}R_2OH \qquad (II)$$

wherein:
   $R_1$ is a hydrogen atom, a $C_1$ to $C_5$ hydrocarbon or an aromatic hydrocarbon having 1 to 3 rings; and
   $R_2$ is a $C_1$ to $C_5$ hydrocarbon or an aromatic hydrocarbon having 1 to 3 rings.

4. The resist removing composition according to claim 1, wherein the polar material is water, methanol or dimethylsulfoxide.

5. The resist removing composition according to claim 1, wherein the attack inhibitor is a compound represented by formula (III):

$$R_6\text{—}(OH)_n \qquad (III)$$

wherein:

$R_6$ is a $C_1$ to $C_5$ hydrocarbon, a $C_1$ to $C_5$ hydrocarbon having a —COOH group, an aromatic hydrocarbon having 1 to 3 rings, or an aromatic hydrocarbon having 1 to 3 rings and a —COOH group in at least one ring, and n is an integer from 1 to 4.

6. The resist removing composition according to claim 1, wherein the fluoride-based reducing agent includes hydrogen fluoride, ammonium fluoride or hydroboron tetrafluoride.

7. The resist removing composition according to claim 1, wherein the hydroxide-based reducing agent includes potassium hydroxide, ammonium hydroxide, tetramethyl ammonium hydroxide or tetraethyl ammonium hydroxide.

8. The resist removing composition according to claim 1, wherein the alkoxy N-hydroxyalkyl alkanamide is in a range from about 30 to about 99.9 weight % based on the total weight of the resist removing composition.

9. The resist removing composition according to claim 1, wherein the alkanol amine is in a range from about 10 to about 69.9999 weight % based on the total weight of the resist removing composition.

10. The resist removing composition according to claim 1, wherein the polar material and the attack inhibitor are, independently in a range from about 0.01 to about 30 weight % based on the total weight of the resist removing composition.

11. The resist removing composition according to claim 1, wherein the fluoride-based reducing agent and the hydroxide-based reducing agent are, independently in a range from about 0.0001 to about 1 weight % based on the total weight of the resist removing composition.

12. The resist removing composition according to claim 1, wherein the alkoxy N-hydroxyalkyl alkanamide, the alkanolamine, the polar material, the attack inhibitor, and the fluoride-based reducing agent and/or the hydroxide-based reducing agent are, respectively, in a range from about 40 to about 65 weight %, in a range from about 5 to about 30 weight %, in a range from about 5 to about 20 weight %, in a range from about 0.01 to about 0.1 weight %, and in a range from about 0.01 to about 0.1 weight %, based on the total weight of the resist removing composition.

13. A resist removing composition comprising:
an alkoxy N-hydroxyalkyl alkanamide;
at least one selected from the group consisting of alkanolamine, a polar material having a dipole moment of 3 or greater and an attack inhibitor; and
hydrogen peroxide.

14. The resist removing composition according to claim 13, wherein the alkoxy N-hydroxyalkyl alkanamide is of the formula (I):

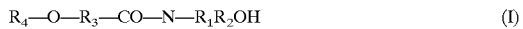

wherein:

$R_1$ is a hydrogen atom, a $C_1$ to $C_5$ hydrocarbon or an aromatic hydrocarbon having 1 to 3 rings, $R_2$ is a $C_1$ to $C_5$ hydrocarbon or an aromatic hydrocarbon having 1 to 3 rings, and $R_3$ and $R_4$ are, independently, a $C_1$ to $C_5$ hydrocarbon.

15. The resist removing composition according to claim 13, wherein the alkanolamine is of the following formula (II):

wherein:

$R_1$ is a hydrogen atom, a $C_1$ to $C_5$ hydrocarbon or an aromatic hydrocarbon having 1 to 3 rings; and $R_2$ is a $C_1$ to $C_5$ hydrocarbon or an aromatic hydrocarbon having 1 to 3 rings.

16. The resist removing composition according to claim 13, wherein the polar material is water, methanol or dimethylsulfoxide.

17. The resist removing composition according to claim 13, wherein the attack inhibitor is a compound represented by formula (III):

wherein:

$R_6$ is a $C_1$ to $C_5$ hydrocarbon, a $C_1$ to $C_5$ hydrocarbon having a —COOH group, an aromatic hydrocarbon having 1 to 3 rings, or an aromatic hydrocarbon having 1 to 3 rings and a —COOH group in at least one ring, and n is an integer from 1 to 4.

18. The resist removing composition according to claim 13, wherein the alkoxy N-hydroxyalkyl alkanamide is in a range from about 30 to about 99.9 weight % based on the total weight of the resist removing composition.

19. The resist removing composition according to claim 13, wherein the alkanol amine is in a range from about 10 to about 69.9999 weight % based on the total weight of the resist removing composition.

20. The resist removing composition according to claim 13, wherein the polar material and the attack inhibitor are, independently in a range from about 0.01 to about 30 weight % based on the total weight of the resist removing composition.

21. The resist removing composition according to claim 13, wherein the hydrogen peroxide is in a range from about 0.0001 to about 1 weight % based on the total weight of the resist removing composition.

22. The resist removing composition according to claim 13, wherein the alkoxy N-hydroxyalkyl alkanamide, the alkanolamine, the polar material, the attack inhibitor and the hydrogen peroxide are, respectively, in a range from about 40 to about 65 weight %, in a range from about 5 to about 30 weight %, in a range from about 5 to about 20 weight %, and in a range from about 0.01 to about 0.1 weight %, based on the total weight of the resist removing composition.

23. A resist removing method comprising the steps of:
providing a substrate;
forming a resist layer on the substrate; and
contacting the substrate with a resist removing composition and removing the resist layer, the resist removing composition comprising an alkoxy N-hydroxyalkyl alkanamide, at least one selected from the group consisting of alkanolamine, a polar material having a dipole moment of 3 or greater and an attack inhibitor, and at least one of a fluoride-based reducing agent and a hydroxide-based reducing agent, or the resist removing composition comprising alkoxy N-hydroxyalkyl alkanamide, at least one selected from the group consisting of alkanolamine, a polar material having a dipole moment of 3 or greater and an attack inhibitor, and hydrogen peroxide.

24. The method according to claim 23, wherein the alkoxy N-hydroxyalkyl alkanamide is of the formula (I):

wherein:

R₁ is a hydrogen atom, a $C_1$ to $C_5$ hydrocarbon or an aromatic hydrocarbon having 1 to 3 rings, R₂ is a $C_1$ to $C_5$ hydrocarbon or an aromatic hydrocarbon having 1 to 3 rings, and R₃ and R₄ are, independently, a $C_1$ to $C_5$ hydrocarbon.

25. The method according to claim 23, wherein the alkanolamine is of the following formula (II):

$$R_1\text{—}NH\text{—}R_2OH \qquad (II)$$

wherein:

R₁ is a hydrogen atom, a $C_1$ to $C_5$ hydrocarbon or an aromatic hydrocarbon having 1 to 3 rings; and R₂ is a $C_1$ to $C_5$ hydrocarbon or an aromatic hydrocarbon having 1 to 3 rings.

26. The method according to claim 23, wherein the polar material is water, methanol or dimethylsulfoxide.

27. The method according to claim 23, wherein the attack inhibitor is a compound represented by formula (III):

$$R_6\text{—}(OH)_n \qquad (III)$$

wherein:

R₆ is a $C_1$ to $C_5$ hydrocarbon, a $C_1$ to $C_5$ hydrocarbon having a —COOH group, an aromatic hydrocarbon having 1 to 3 rings, or an aromatic hydrocarbon having 1 to 3 rings and a —COOH group in at least one ring, and n is an integer from 1 to 4.

28. The method according to claim 23, wherein the fluoride-based reducing agent includes hydrogen fluoride, ammonium fluoride or hydroboron tetrafluoride.

29. The method according to claim 23, wherein the hydroxide-based reducing agent includes potassium hydroxide, ammonium hydroxide, tetramethyl ammonium hydroxide or tetraethyl ammonium hydroxide.

30. The method according to claim 23, wherein the alkoxy N-hydroxyalkyl alkanamide is in a range from about 30 to about 99.9 weight % based on the total weight of the resist removing composition.

31. The method according to claim 23, wherein the alkanol amine is in a range from about 10 to about 69.9999 weight % based on the total weight of the resist removing composition.

32. The method according to claim 23, wherein the polar material and the attack inhibitor are, independently in a range from about 0.01 to about 30 weight % based on the total weight of the resist removing composition.

33. The method according to claim 23, wherein the fluoride-based reducing agent and the hydroxide-based reducing agent are, independently in a range from about 0.0001 to about 1 weight % based on the total weight of the resist removing composition.

34. The method according to claim 23, wherein the hydrogen peroxide is in a range from about 0.0001 to about 1 weight % based on the total weight of the resist removing composition.

35. The method according to claim 23, after said contacting, further comprising:

rinsing the substrate; and drying the substrate.

36. The method according to claim 23, wherein said contacting is performed at a temperature in a range from about 45° C. to about 70° C.

37. The method according to claim 23, wherein before said contacting, the substrate is processed using the resist layer.

* * * * *